(12) United States Patent
Sakuma et al.

(10) Patent No.: US 7,998,812 B2
(45) Date of Patent: Aug. 16, 2011

(54) SEMICONDUCTOR DEVICE

(75) Inventors: Makoto Sakuma, Yokohama (JP);
Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/729,273

(22) Filed: Mar. 23, 2010

(65) Prior Publication Data
US 2010/0177546 A1  Jul. 15, 2010

Related U.S. Application Data

(63) Continuation of application No. 11/851,078, filed on Sep. 6, 2007, now Pat. No. 7,701,742.

(30) Foreign Application Priority Data

Sep. 6, 2006  (JP) .................................. 2006-241775
Sep. 4, 2007  (JP) .................................. 2007-228882

(51) Int. Cl.
*H01L 21/8244* (2006.01)
(52) U.S. Cl. .. 438/258; 438/257; 438/593; 438/E21.027
(58) Field of Classification Search .......... 438/257–258, 438/296, 593; 257/314–316
See application file for complete search history.

(56) References Cited

U.S. PATENT DOCUMENTS

| | | | |
|---|---|---|---|
| 5,251,168 A | 10/1993 | Chung et al. | |
| 6,265,739 B1 | 7/2001 | Yaegashi et al. | |
| 6,376,879 B2 | 4/2002 | Mori et al. | |
| 6,521,941 B2 | 2/2003 | Park et al. | |
| 6,734,065 B2 | 5/2004 | Yim et al. | |
| 6,902,976 B2 | 6/2005 | Matsui et al. | |
| 6,998,673 B2 | 2/2006 | Matsui et al. | |
| 7,075,826 B2 | 7/2006 | Lee et al. | |
| 7,154,582 B2 | 12/2006 | Ohsaki | |
| 7,382,016 B2 | 6/2008 | Matsui et al. | |
| 7,528,046 B2 | 5/2009 | Ichige et al. | |
| 2002/0098652 A1 | 7/2002 | Mori et al. | |
| 2005/0130410 A1* | 6/2005 | Oweyang et al. | 438/637 |
| 2006/0197136 A1 | 9/2006 | Futatsuyama et al. | |
| 2006/0237758 A1 | 10/2006 | Kinoshita | |
| 2008/0014727 A1* | 1/2008 | Takaishi | 438/510 |
| 2009/0014841 A1 | 1/2009 | Yanagidaira et al. | |
| 2009/0279356 A1 | 11/2009 | Hashimoto et al. | |

FOREIGN PATENT DOCUMENTS

| | | |
|---|---|---|
| JP | 6-181164 | 6/1994 |
| JP | 11-31799 | 2/1999 |

* cited by examiner

*Primary Examiner* — Dung A. Le
(74) *Attorney, Agent, or Firm* — Oblon, Spivak, McClelland, Maier & Neustadt, L.L.P.

(57) ABSTRACT

A semiconductor device includes a memory cell array area, a peripheral circuit area on a periphery of the memory cell array area, and a boundary area having a specific width between the memory cell array area and the peripheral circuit area, the memory cell array area including a cell area including non-volatile semiconductor memory cells, linear wirings extending from inside of the cell area to an area outside the cell area, and lower layer wirings in a lower layer than the linear wirings in the boundary area and electrically connected to the linear wirings, and wiring widths of the lower layer wirings being larger than widths of the linear wirings, the peripheral circuit area including a patterns electrically connected to the linear wirings via the lower layer wirings, the boundary area failing to be provided with the linear wirings and a wiring in same layer as the linear wirings.

11 Claims, 9 Drawing Sheets

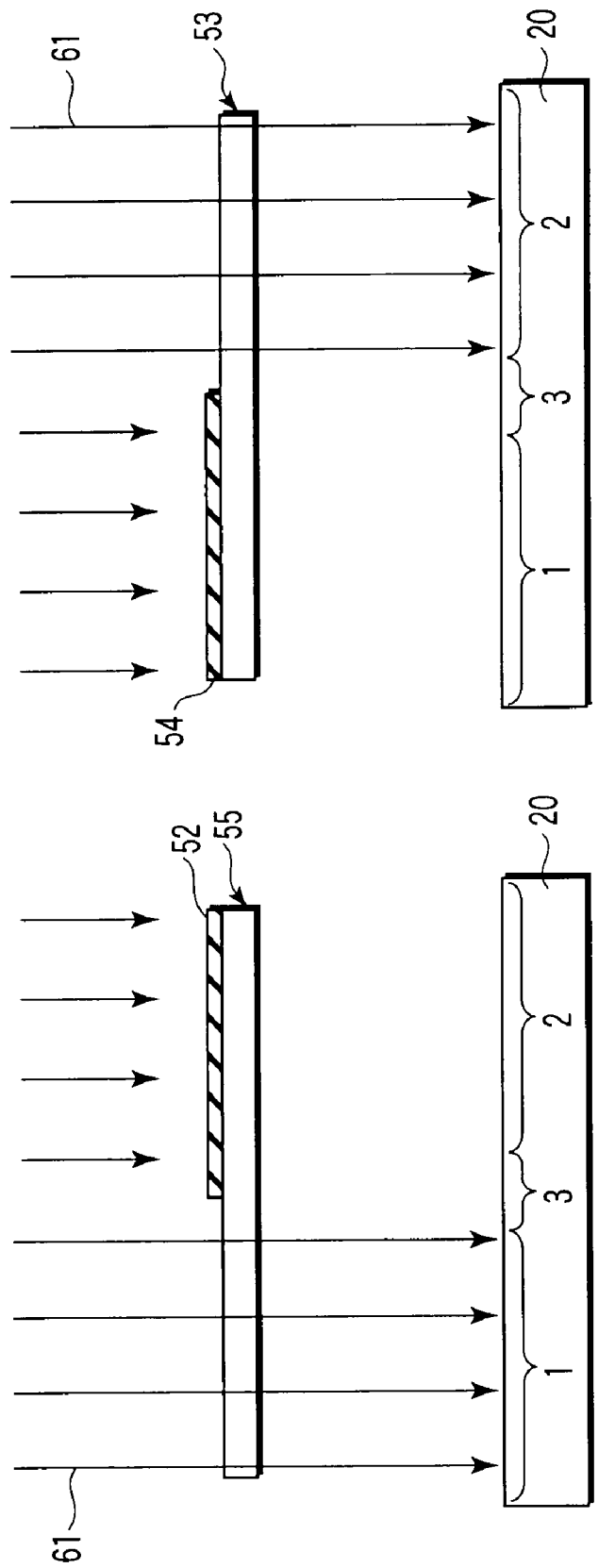

SEMICONDUCTOR DEVICE

CROSS-REFERENCE TO RELATED APPLICATIONS

This application is a continuation of and claims the benefit of priority under 35 U.S.C. §120 from U.S. Ser. No. 11/851,078 filed Sep. 6, 2007, and claims the benefit of priority under 35 U.S.C. §119 from Japanese Patent Applications No. 2006-241775 filed Sep. 6, 2006 and No. 2007-228882 filed Sep. 4, 2007, the entire contents of each of which are incorporated herein by reference.

BACKGROUND OF THE INVENTION

1. Field of the Invention

This invention relates to a semiconductor device including a nonvolatile semiconductor memory.

2. Description of the Related Art

A nonvolatile semiconductor memory is one of the semiconductor memory devices. Recently, there have been strong demands for the nonvolatile semiconductor memory as a data storage device. Typical nonvolatile semiconductor memories are NOR type flash memory and NAND type flash memory.

To increase the storage capacity of the flash memories, the miniaturization of device elements is in progress. Especially, as the NAND type flash memories have advantages in miniaturization, their storage capacity is being made larger.

A NAND type flash memory comprises a memory cell array area and a peripheral circuit area provided around the memory cell array area (Jpn. Pat. Appln. KOKAI Publication No. 11-31799). The memory cell array area comprises a relatively simple and periodic line-and-space pattern (L & S pattern). The L & S pattern is suitable for miniaturization. Therefore, enhancing the ability of an exposure apparatus makes it possible to form a memory cell array area including dense and large-capacity memory cells. On the other side, as the peripheral circuit area is generally made of irregular patterns, it is not suitable for miniaturization.

In the current process of NAND type flash memory, when the memory cell array area and the peripheral circuit area are exposed at the same time, the miniaturization of the patterns in the memory cell array area is limited by pattern forming capability of the peripheral circuit area.

BRIEF SUMMARY OF THE INVENTION

According to an aspect of the present invention, there is provided a semiconductor device comprising: a memory cell array area; a peripheral circuit area provided on a periphery of the memory cell array area; and a boundary area having a specific width provided between the memory cell array area and the peripheral circuit area; the memory cell array area comprising a cell area including a plurality of nonvolatile semiconductor memory cells, a plurality of linear wirings extending from inside of the cell area to an area outside the cell area, and a plurality of lower layer wirings which are provided in a lower layer than the plurality of linear wirings in the boundary area and electrically connected to the plurality of linear wirings, and wiring widths of the plurality of lower layer wirings being larger than widths of the plurality of linear wirings; the peripheral circuit area including a plurality of patterns electrically connected to the plurality of linear wirings via the plurality of the lower layer wirings; the boundary area failing to be provided with the plurality of linear wirings and a wiring which is in same layer as the plurality of linear wirings.

BRIEF DESCRIPTION OF THE SEVERAL VIEWS OF THE DRAWING

FIGS. 9A and 9B are schematic views showing an exposure method of the embodiment;

DETAILED DESCRIPTION OF THE INVENTION

First Embodiment

Figure 1:
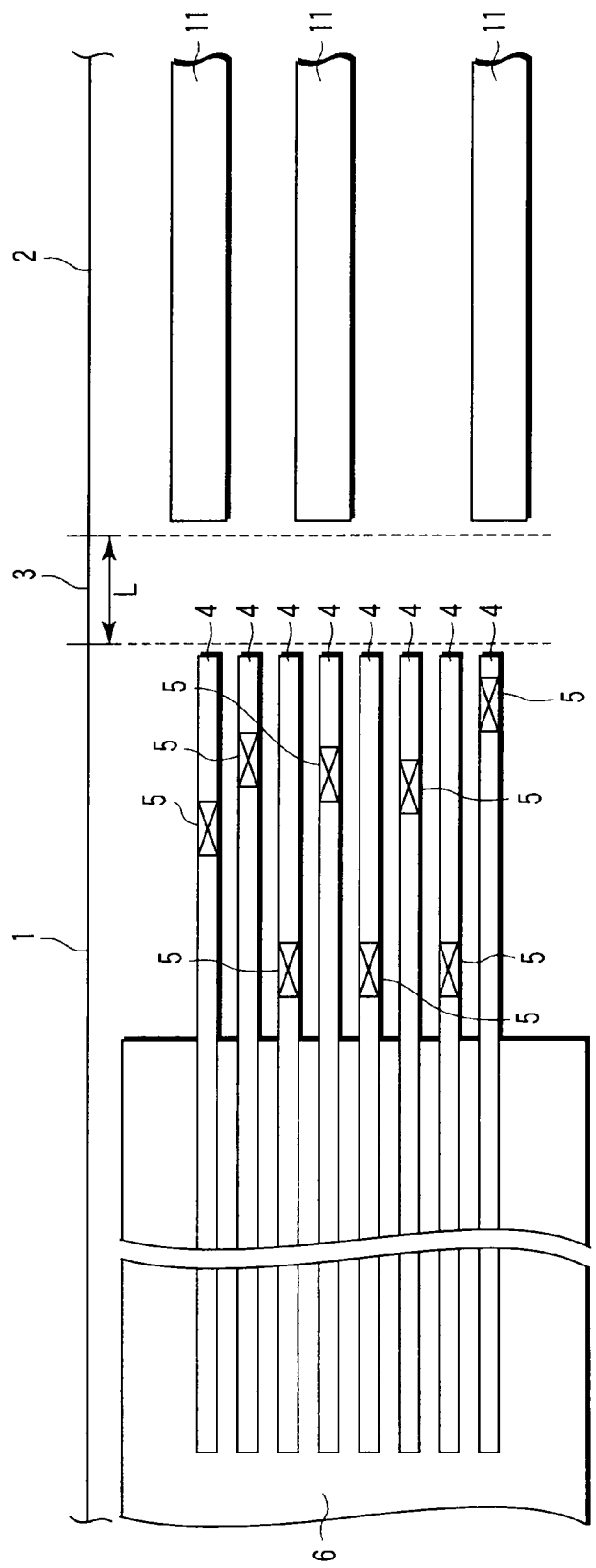
FIG. 1 is a plan view schematically showing a semiconductor device including a nonvolatile semiconductor memory such as a NAND type flash memory in accordance with a first embodiment.

FIG. 1 is a plan view schematically showing a semiconductor device including a nonvolatile semiconductor memory such as a NAND type flash memory in accordance with a first embodiment.

As described above, when a memory cell array area and a peripheral circuit area are exposed at the same time, the miniaturization of the patterns in the memory cell array area is limited by pattern forming capability of the peripheral circuit area.

So, in the present embodiment, for further miniaturization, the process of exposing the memory cell array area 1 and the peripheral circuit area 2 separately is used. That is, double exposure (multiple exposures), in which the memory cell array area 1 is exposed under conditions optimized for the area 1 and the peripheral circuit area 2 is exposed under conditions optimized for the area 2, is performed.

In the present embodiment, for double exposure, a boundary area 3 is provided between the memory cell array area 1 and the peripheral circuit area 2. The boundary area 3 causes the memory cell array area 1 and peripheral circuit area 2 to be spaced at a specific distance (specific width) apart. In the boundary area 3, there is no pattern to be damaged by leakage light occurred in the exposure process. Concretely speaking, a plurality of wiring patterns formed by double exposure do not exist, but a pattern of operational device such as gate line of a transistor arranged in a lower layer of the plurality of wiring patterns and a metal wiring arranged in an upper layer of the plurality of wiring patterns may exist.

In a case where the boundary area 3 does not exist, there is a possibility that the peripheral circuit area 2 is exposed by leakage light occurred in the step of exposing the memory cell array area 1. There is a possibility that a desired pattern will not be formed in the peripheral circuit area 2 because of the exposure by the leakage light. Similarly, there is a possibility that a desired pattern will not be formed in the memory cell array area 1 because of the exposure of the memory cell array area 1 by leakage light occurred in the step of exposing the peripheral circuit area 2.

On the other hand, in the present embodiment, the boundary area 3 is provided such that the peripheral circuit area 2 is not exposed by the leakage light occurred in the step of exposing the memory cell array area 1 and the memory cell array area 1 is not exposed by the leakage light occurred in the step of exposing the peripheral circuit area 2, and the width L of the area 3 is set to a specific width. Thereby, when one of the area 1 and area 2 is exposed (single exposure and double exposure), the effect of the leakage light to the other area is suppressed. Here, to prevent high integration from being inhibited, the width L of the boundary area 3 is set to a value not more than necessary.

There is a possibility that the boundary area 3 is exposed by the leakage light occurred in the step of exposing the memory cell array area 1. However, since the boundary area 3 has no pattern to be damaged by the leakage light, there is no problem even if the boundary area 3 is exposed. There is a possibility that the boundary area 3 is exposed by the leakage light occurred in the step of exposing the peripheral circuit area 2. However, since the boundary area 3 has no pattern to be damaged by the leakage light, there is no problem even if the peripheral area 2 is exposed.

In the memory cell array area 1, a cell area 6 is formed, device elements for storing date such as memory transistor is arranged. In addition, in the memory cell array area 1, linear bit lines 4 are arranged. The bit lines 4 are wirings which are connected to the peripheral circuit. Here, each of the linear bit lines 4 is designed to have the same length and both sides of the linear bit lines 4 are aligned with one another. The bit lines 4 serving as linear wirings provided so as to extend from inside of the cell area in the memory cell array area to the outside of the cell area are connected to wiring patters of the peripheral circuit area 2 via lower layer wirings provided in a lower layer of bit lines 4 and high breakdown voltage devices which are provided in a layer lower than the bit lines 4 as described later. The linear bit lines 4 make a line-and-space pattern where the layout (bit line layout) is done with a specific interval.

The design values of the width of the bit line 4 and the specific interval (space width) between the bit lines 4 are the minimum dimensions (the minimum design rule) of the patters in the memory cell array area 1. Here, the minimum design rule is dimension of a side of the memory cell. Even when the design values are set to the minimum dimensions, if the bit line layout is a line and space pattern, it is possible to form desired bit lines without being affected by lithography process.

Here, depending on the effect of the lithography process, the width of the bit lines 4 is not necessarily constant. For example, there is a possibility that the bit lines 4 taper off at their end (shortening). In such a case, when double exposure is made, the memory cell array area 1 is adjusted (tuned) and exposed under the optimized condition, thereby forming bit lines 4.

Each of the bit lines 4 is provided with a contact 5 for connecting with the corresponding lower layer wiring. Each contact 5 is provided in an area outside the cell area 6 in the memory cell array area.

Here, the arrangement of contacts 5 is such that contacts 5 are not arranged adjacently in a neighboring bit lines. That is, the contacts 5 formed in the neighboring bit lines are displaced in a direction of bit line 4 extending. In addition, the neighboring contacts 5 are arranged via at least one bit line.

In addition, in the cell area 6 in which the bit lines 4 exist, word lines (not shown) formed according to the same design rule as those of the bit liens 4 and an active area (AA, not shown) are formed.

Figure 2:
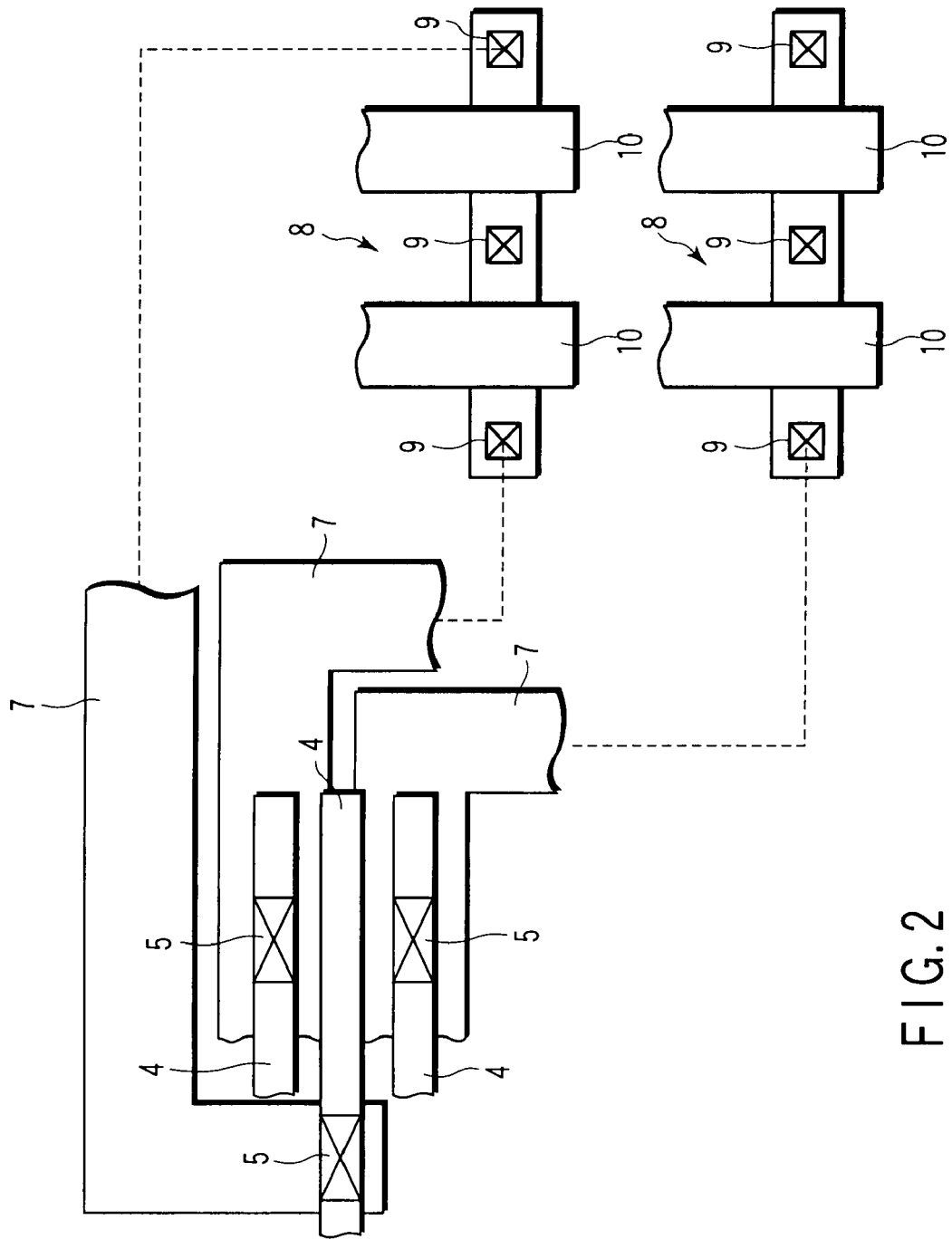
FIG. 2 is a plan view schematically showing a bit line and a pattern in a layer lower than the bit line in the semiconductor device including the nonvolatile semiconductor memory such as the NAND type flash memory in accordance with the first embodiment.
Figure 3:
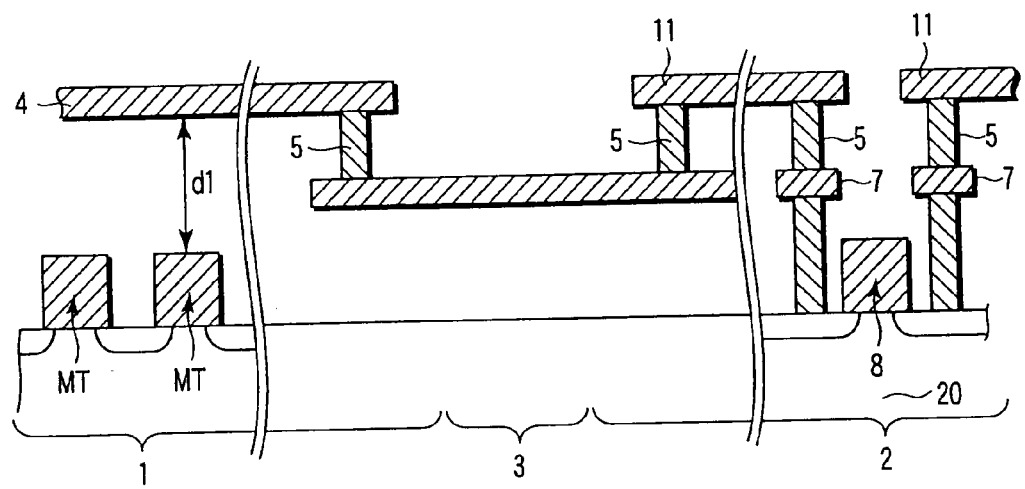
FIG. 3 is a cross section view showing a comparative example of the structure shown in FIG. 2.

Each of the bit lines 4 is connected via the contact 5 to the lower layer wiring 7 as shown in FIG. 2. Since the lower layer wiring 7 is formed by double exposure, and the minimum design rule which is larger than bit line 4 is adopted, the width of the lower layer wiring 7 can be larger than the width of the bit lines 4. This is realized by the arrangement of contacts 5 in which the contacts 5 of neighboring bit lines 4 are displaced in the direction of bit line 4. That is, the lower layer wiring 7 can be arranged in a manner that the lower layer wiring 7 detours the contact 5 connected to the bit line 4 neighboring the lower layer wiring 7. The lower layer wiring 7 is connected to one of the source/drain region 9 of the high breakdown voltage MOS transistor 8 of lower layer, as shown in FIG. 3. The gate electrode 10 of the high breakdown voltage MOS transistor 8 is connected to a voltage source for applying a gate voltage.

Under the gate electrode 10, there is a gate insulating film (not shown), the film thickness of the gate insulating film is set somewhat on the thick side to secure a breakdown voltage. The other of the source/drain region 9 is connected to the wiring 11 in the peripheral circuit area 2. The wiring 11 is connected to, for example, a sense amplifier. Since the peripheral circuit area 2 demands less miniaturization than the memory cell array area 1, the minimum design rule of the peripheral circuit area 2 is larger than the minimum design rule of the memory cell array region 1. Therefore, the width of the wiring 11 can be wider than the width of the bit line 4.

While in this embodiment, the bit line 4 is connected to the sense amplifier in the peripheral circuit area 2 via the lower layer wiring 7, high breakdown voltage device 8, and wiring 11 in the same layer as the bit line 4, it is not limited to the high breakdown voltage device 8 as shown in a cross section view of FIG. 3. For example, a low breakdown voltage transistor (which operates at about 3.0 V), resistance element or capacitance element is applicable. In addition, in FIG. 3, 20 denotes silicon substrate.

Figure 4:
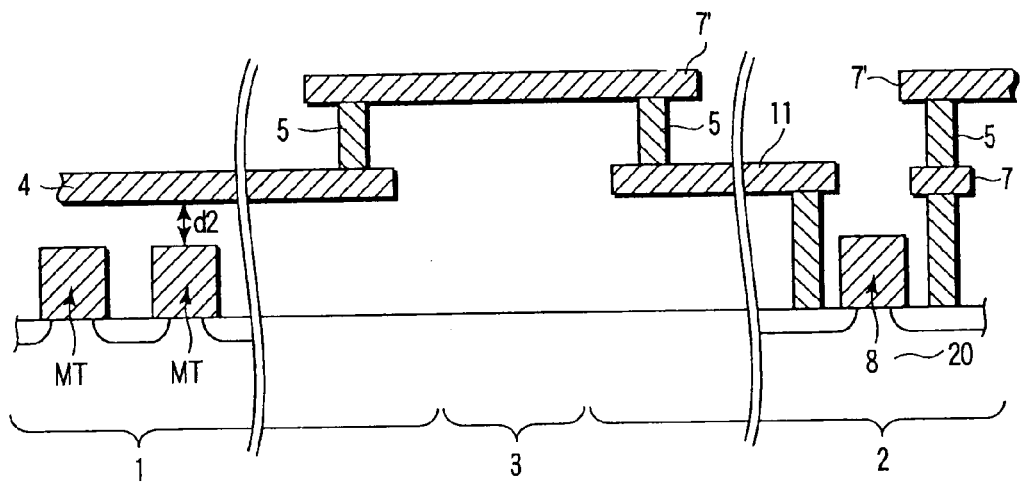
FIG. 4 is a cross section view showing a connection structure between the bit line and a wiring in a peripheral circuit area.

In FIG. 3, though the bit line 4 and the wiring 11 are connected by the under lower layer wiring structure (contact 5, lower layer wiring 7), as shown in FIG. 4, it can be supposed that the bit line 4 and the wiring 11 are connected by an upper layer wiring structure (contact 5, upper layer wiring 7'). However, in a case of FIG. 4 (comparative example), comparing to FIG. 3, the distance between the bit line 4 and the silicon substrate 20 is short. That is, it means that the distance d2 between the line 4 and the cell transistor in the structure of FIG. 4 is shorter than the distance d1 shown in FIG. 3. For that reason, the structure of FIG. 4 has a problem that capacitance between the cell transistor and bit line 4 is large.

In addition, in the NAND type flash memory, there is a case that the memory cell transistor is set to have a 2 layers electrode structure and the high breakdown voltage device formed in the peripheral circuit area is set to have a 1 layer electrode structure. In this case, the height of bit line 4 from the silicon substrate 20 is higher than the wiring 11.

In this case, comparing to the structure of FIG. 3 (embodiment), as the height of bit line 4 and the height of the wiring 11 from the silicon substrate are different, the processing by lithography is hard to be performed, so it required to form the bit line 4 and the wiring 11 in different step respectively. For that reason, the process is complicated. In addition, as the height of bit line 4 and the height of the wiring 11 from the silicon substrate, a step arises on a surface of an interlayer dielectric film on the bit line 4 and the wiring 11. Lithography margin of a pattern formed on this step decreases. The decreasing of the lithography margin causes a big trouble to the device in which miniaturization is advanced, such as NAND type flash memory. For example, a pattern is not formed as desired, one continuous pattern is severed. On the hand, in order to set the height of bit line 4 and the height of the wiring 11 from the silicon substrate at the same level, it may be considered to form the interlayer dielectric film on the high breakdown voltage device, but it causes complication of step.

Figure 6:
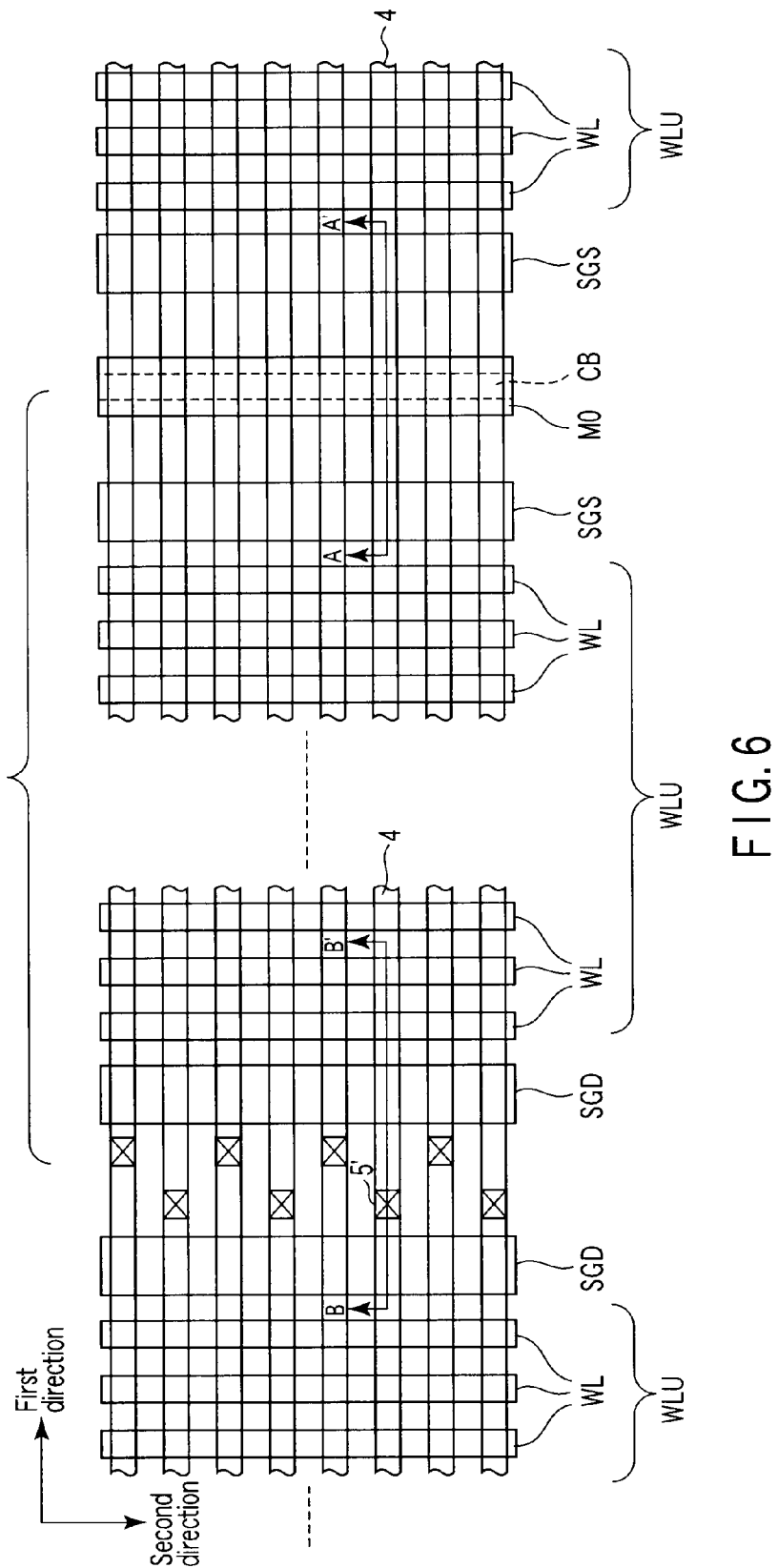
FIG. 6 is a plan view showing a part of cell area.

FIG. 6 is a plain view showing a part of cell area 6. In FIG. 6, bit lines 4 are formed on the semiconductor substrate. Bit lines 4 have strip shapes extending along the first direction. The bit lines 4 is formed along the second direction. And word lines WL having strip shapes extending along the second direction are formed over the bit lines 4, the predetermined numbers of word lines WL constitute a word line unit WLU. Further, select gates SGD and SGS having strip shapes extending along the second direction are formed so as to sandwich the word line unit WLU. And memory cell transistors (not shown) are formed under portions where the word line WL and bit line 4 intersect, select transistors (not shown) are formed on areas where the select gates SGD and SGS intersect respectively. Here, the minimum design rule is dimension of a side of the memory cell transistor.

A common source line M0 which is in the same layer as the lower wiring 7 of FIG. 2 or FIG. 3 extends along the first direction. Under this common source line M0, a contact bit CB comprising one line and connecting to the active area (not shown) is formed. In addition, the contact bit CB may be comprise a plurality of circles, moreover, these circles may be arranged on a line or arranged in a zigzag configuration.

A contact bit 5' is formed on the each of the bit line 4 between the select gates SGD.

Figure 7:
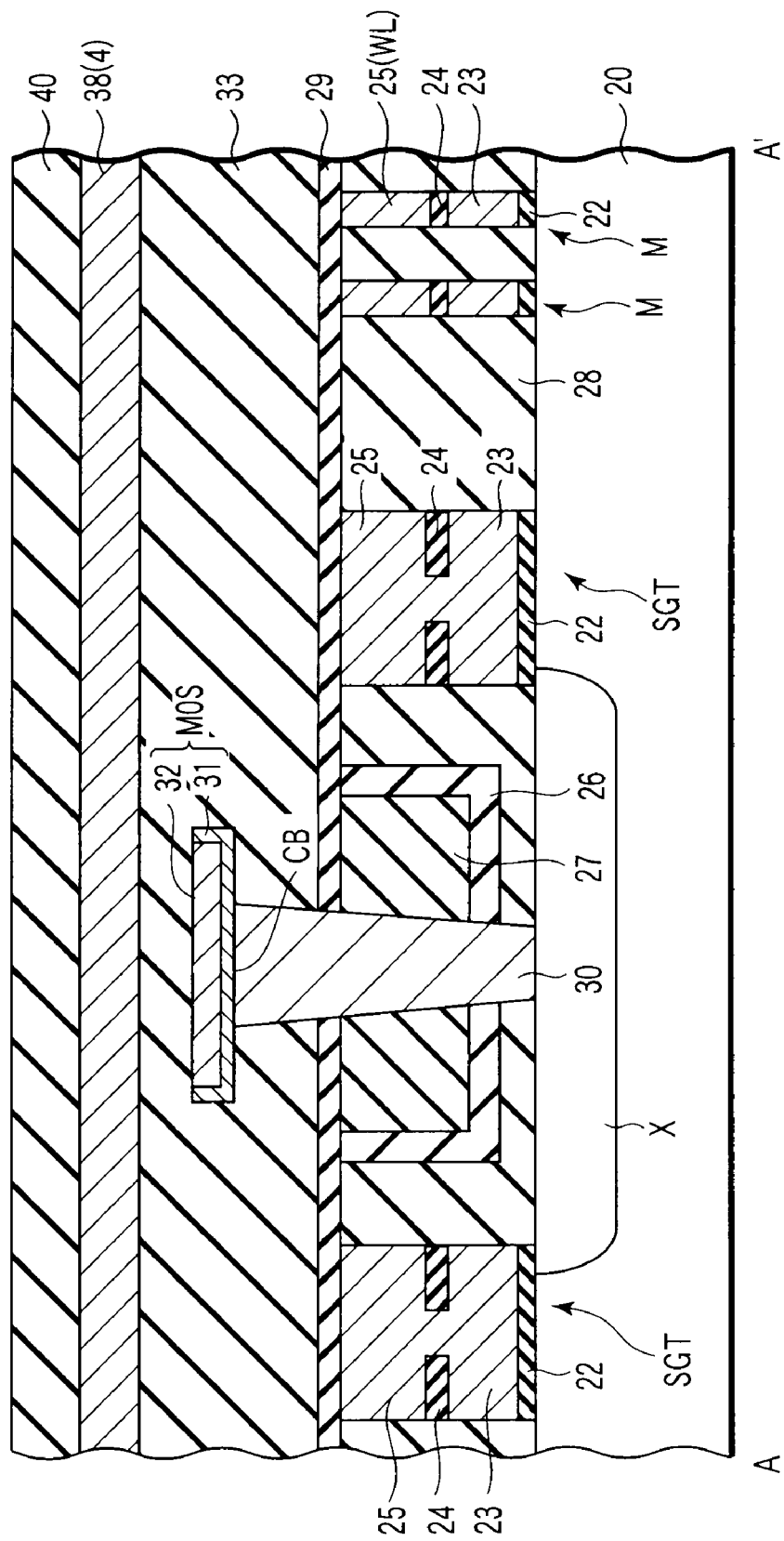
FIG. 7 is a A-A' cross section view of FIG. 6.
Figure 8:
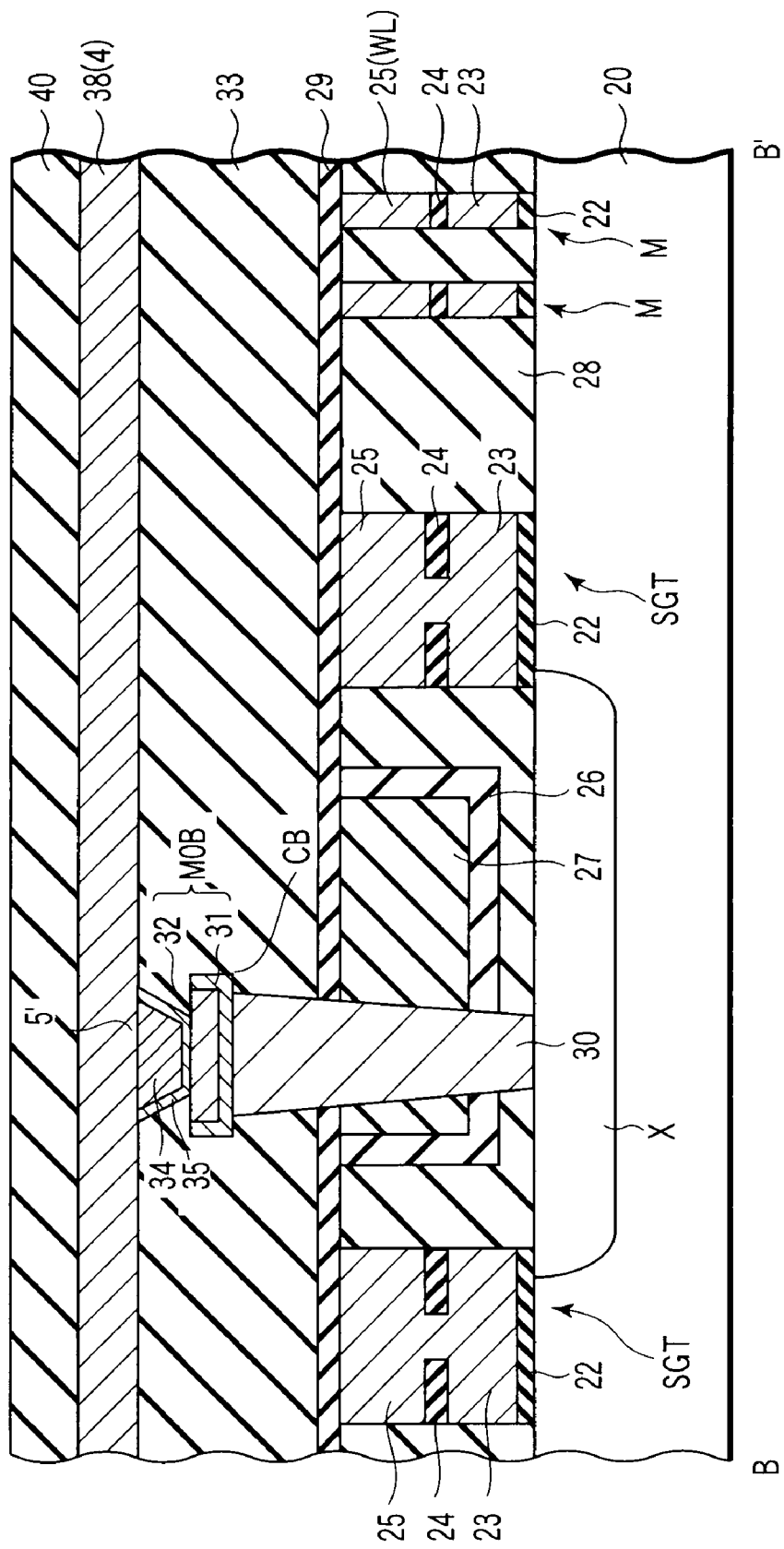
FIG. 8 is a B-B' cross section view of FIG. 6.

FIG. 7 is an A-A' cross section view of FIG. 6 (source side cross section view), FIG. 8 is a B-B' cross section view of FIG. 6 (drain side cross section view).

In FIG. 7 and FIG. 8, a tunnel oxide film 22 is formed on a silicon substrate, a gate electrode M of the cell transistor and a gate electrode SGT of the select transistor are formed on this tunnel oxide film 22. The gate electrodes M and SGT include a polycrystalline silicon layer 23 formed on the tunnel oxide film 22, an inter-gate insulating film 24 formed on the polycrystalline silicon layer 23, a polycrystalline silicon layer 25 formed on the inter-gate insulating film 24. The inter-gate insulating film 24 is formed of an ON film, a NO film, or an ONO film for instance. Relating to the gate electrodes M of select transistors, the polycrystalline silicon layers 23 are isolated each other between active areas (not shown) neighboring in the word line WL direction, and the polycrystalline silicon layers 23 function as floating gates. In addition, word line WL is formed of the polycrystalline silicon layer 25. And the polycrystalline silicon layers 25 between active areas (not shown) neighboring in the word line WL direction are connected in common. Relating to the gate electrode SGT of select transistor, a part of the inter-gate insulating film 24 is removed, the polycrystalline silicon layer 23 and 25 are connected electrically. And the polycrystalline silicon layer 23 and 25 function as the select gate lines SGD and SGS.

And the first interlayer insulating film is formed between the gate electrodes M and SGT of the memory cell transistors and the select transistors. A U-shaped insulating film 26 is formed between the select transistors. The insulating film 26 is formed of a silicon nitride film for instance. The second interlayer insulating film is formed in a U-shaped portion of the insulating film 26. The second interlayer insulating film is formed of BPSG for instance. The first and second interlayer insulating films 28 and 27 and the insulating film 26 are covered with a barrier film 29. The contact bit CB penetrating the barrier film 29, the second interlayer insulating film 27 and the insulating film 26 and reach impurity diffusion layer area X is formed. And a top surface of the contact bit CB is connected to a tungsten wiring 32 via a barrier metal 31. The common source line M0 comprises an M0 wring M0S formed of the barrier metal 31 and the tungsten wiring 32

The M0 wrings M0S and M0B are covered with the third interlayer insulating film 33 formed on the barrier film 29. The bit line 4 is formed on the third interlayer insulating film 33. The bit line 4 is formed of cupper wiring 38 for instance. Here, for example, a tungsten plug 34 penetrating the third interlayer insulating film 33 is formed on a top surface of the M0 wring M0B. The M0 wring M0B is connected to the bit line 4 via the tungsten plug 34. In addition, a top surface of the copper wiring 38 is covered with the fourth interlayer insulating film 40.

Here, in FIG. 7, the M0 wrings M0B constituting the common M0 wiring M0 and the bit line 4 intersect via the third interlayer film 33.

That is, in a case of the present embodiment, the common source line (M0) is under the bit line 4. The distance between the neighboring bit lines 4 is very short. For that reason, when the common source line is arranged above the bit line, it is hard to connect the common source line to the diffusion layer (source) via the contact bit CB which passes through between the bit lines 4.

In addition, in a case of a structure in which the common source line is the upper layer than the bit line or in a case of a structure in which the common source line and the bit line are in the same layer, as the contact bit CB is passed through between the bit lines 4, a pattern layout of the cell area 6 is not a repetition of the same pattern, a pattern collapse is arisen in the cell area 6. Therefore, the above two structures are not suitable for miniaturization.

Moreover, although the high breakdown voltage device 8 which is not formed by double exposure, is usually in the peripheral circuit area 2, it may be in the boundary area 3. Furthermore, what is provided in the peripheral circuit area 2 may be a word line driving circuit for driving the word lines of the memory cells in the cell area 6.

Figure 5:
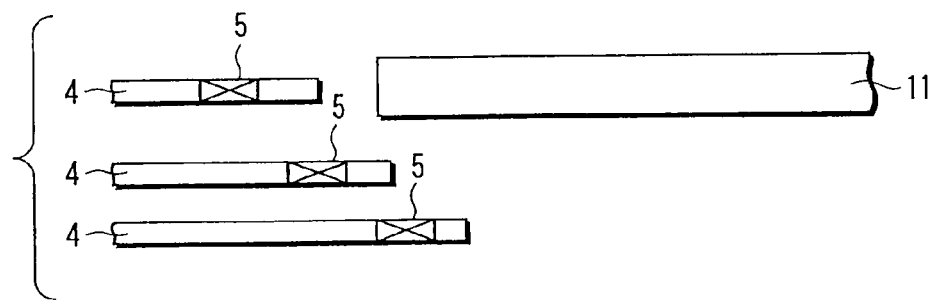
FIG. 5 is a plan view showing a comparative example of a bit line layout.

FIG. 5 shows an example of the layout of bit lines 4 of the semiconductor device as a comparative example formed without using double exposure. For clarity, three bit lines 4 are shown. In FIG. 3, the lower two bit lines 4 extend to under the wiring 11 of the peripheral circuit area connected to the sense amplifier. That is, existence or nonexistence of the boundary area 3 of the present embodiment is recognized by arrangement of the bit line 4 and the wiring 11 of the peripheral circuit area, the boundary area 3 exists if there is a portion where the bit line 4 and the wiring 11 of the peripheral circuit area arranged in parallel.

The semiconductor device manufacturing method of the present embodiment is characterized by exposing the memory cell array area 1 and the peripheral circuit area 2 separately. An exposure apparatus used to expose the memory cell array area 1 has a higher resolution (a larger lens numeric aperture of the exposure apparatus) than that of an exposure apparatus used to expose the peripheral circuit area 2.

At first, exposure method of the present embodiment is explained. When the memory cell array area 1 is exposed, a mask 51 shown in FIG. 9A is used. On this mask 51, only the pattern of the memory cell array area 1 is drawn, the pattern of the peripheral circuit area 2 is not drawn, and transmission of light is prevented (light shielding). That is, it is equivalent as the mask 51 comprises a light shielding portion 52 for preventing the peripheral circuit area 2 from being irradiated with light 61. Further, light shielding portion 52 is provided on a transparent substrate of the mask 51. On the other side, when the peripheral circuit area is exposed, a mask 53 shown in FIG. 9B is used. On this mask 53, only the pattern of the peripheral circuit area 2 is drawn, the pattern of the memory cell array area 1 is not drawn, and transmission of light is prevented (light shielding). That is, it is equivalent as the mask 53 comprises a light shielding portion 54 for preventing the memory cell array area 1 from being irradiated with light 61. Further, this light shielding portion 54 is provided on a transparent substrate of the mask 51. In the present embodiment, the different mask is used for exposing each of the memory cell array area 1 and peripheral circuit area 2.

Figure 10B:
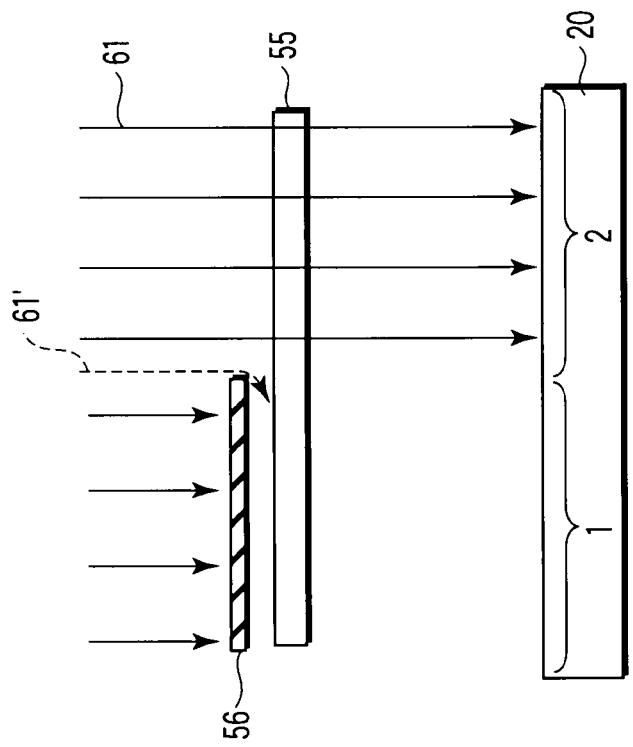
FIGS. 10A and 10B are schematic views showing an exposure method of a comparative example.
Figure 10A:
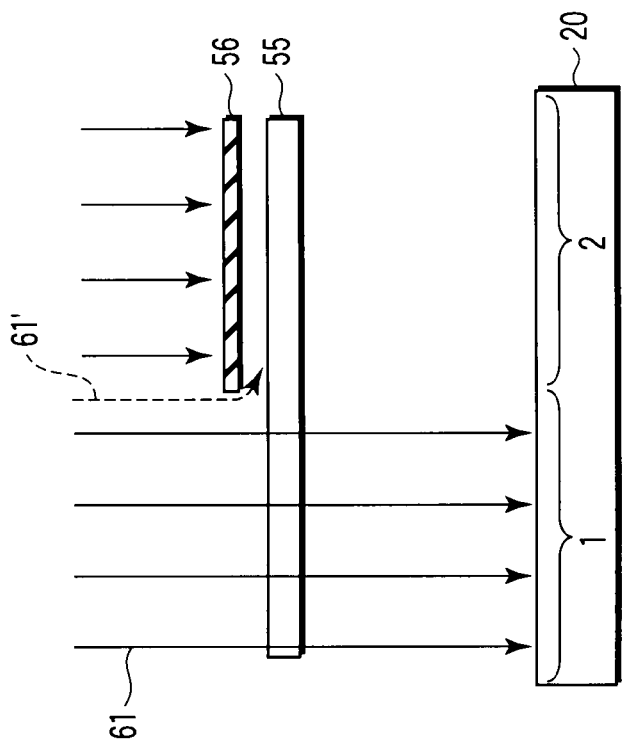

FIG. 10A and FIG. 10B show an exposure method of a comparative example. In a case of the comparative example, the same mask 55 is used for exposing the memory cell array area 1 and peripheral circuit area 2, patterns of memory cell array area 1 and peripheral circuit area 2 are drawn. When the cell area 1 is exposed, as shown FIG. 10A, a light shielding member 56 is positioned above the mask 55 so that the peripheral circuit area 2 is prevented from being irradiated with light 61. But, in fact, a part of the light 61 (61') enters into a gap between the mask 55 and the light shielding member 56, thereby a part of the memory cell array area 1 is exposed. In addition, the misalignment between the mask 5 and the light shielding member 56 can not be avoided. Therefore, the comparative example needs wider boundary area 3 than the present embodiment, which causes increasing of area of the semiconductor device. On the other side, according to the present embodiment, the light shielding portions 52, 54 are provided on the transparent substrates of the mask 51, 53, the boundary area 3 can be reduced.

Since the semiconductor device of the first embodiment is configured to be formed by double exposure, the limitation of miniaturization of the pattern in the memory cell array area 1 due to the pattern forming capability of the peripheral circuit area 2 is suppressed. This makes it possible to further miniaturize the pattern in the memory cell array area as in a NAND memory device with the dense cell area.

Second Embodiment

Figure 11:
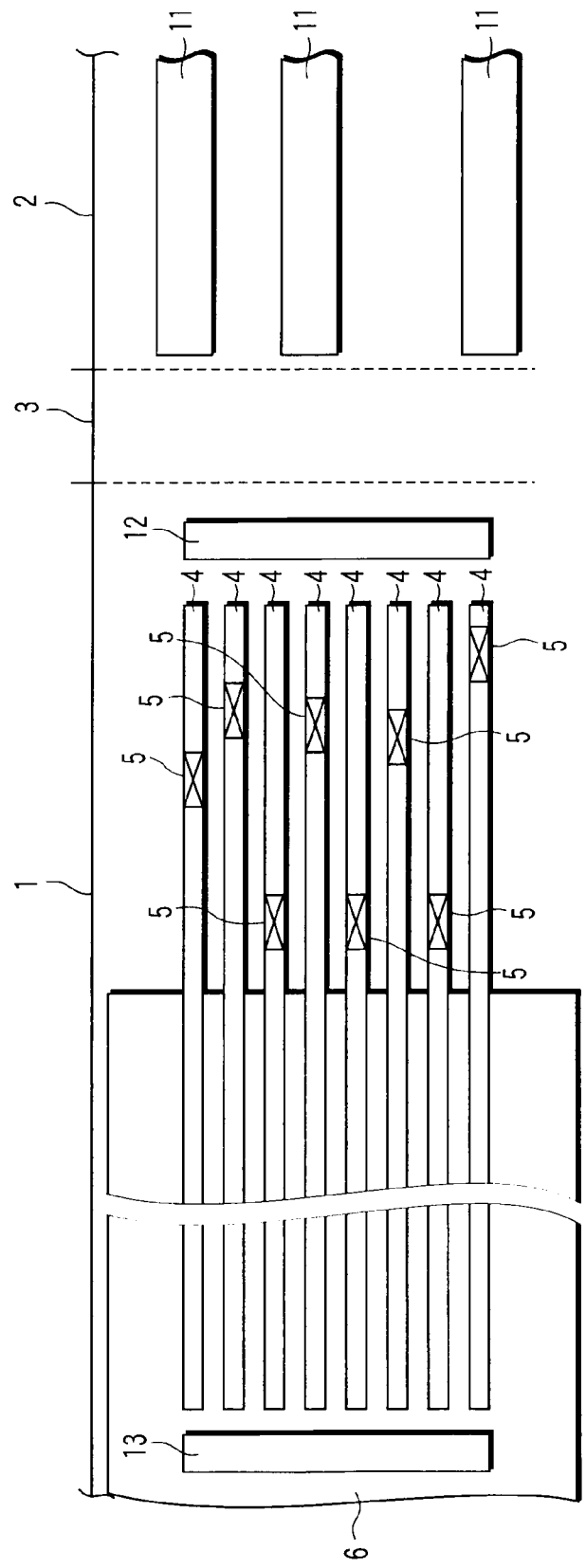
FIG. 11 is a plan view schematically showing a semiconductor device including a NAND type flash memory in accordance with a second embodiment.

FIG. 11 is a plan view schematically showing a semiconductor device including a nonvolatile semiconductor memory such as a NAND type flash memory in accordance with a second embodiment. In FIG. 4, the same reference numerals as FIG. 1 are given to designate portions corresponding to FIG. 1, and the detail explanation is omitted.

The second embodiment differs from the first embodiment in that shunt parts 12, 13 are provided on the same layer as that of the bit lines 4 in the memory cell array area 1.

The shunt part 12 is provided outside the cell area 6 (on the bounder area 3 side). The shunt part 13 is provided in the cell area 6 (on the opposite side of the shunt part with the bit line 4 therebetween). The longitudinal direction of the shunt parts 12, 13 is perpendicular to the longitudinal direction of the bit lines 4.

The shunt parts 12, 13 are for preventing the ends of the bit lines 4 from tapering (or shortening) due to a lithography process. Therefore, the shunt parts 12, 13 are provided somewhat close to the bit lines 4. The distance between the shunt parts 12, 13 and the ends of the bit lines 14 is, for example, 1 μm or less, or 0.4 μm or less.

The width of the shunt parts 12, 13 is larger than the width of the bit lines 4. Exposure of the memory cell array area 1 is optimized for fine patterns. Therefore, there is a possibility that the wide shunt parts 12, 13 are not be formed accurately. However, even if the patterns of the shunt parts 12, 13 have collapsed somewhat, shortening is prevented. Since the shunt parts 12, 13 are not fine patterns constituting operational device, they are not required to have high dimension accuracy.

While in the present embodiment, the shunt parts are provided on both sides of the bit lines 4, the shunt parts may be provided only on one side of the bit lines 4.

In addition, to prevent shortening, wiring perpendicular to the bit lines 4 may be provided on the same layer as that of the bit lines 4 in the memory cell array area 1. The width of the wiring is larger than that of the bit lines 4. Moreover, a pattern (e.g., wiring) may be provided in parallel with the bit lines 4 on the same layer as that of the bit lines 4. The purpose of the pattern is to serve as dummy wiring to prevent the bit lines operating in the periphery of the array from tapering. The present invention is not limited to the first and second embodiments. For instance, the invention may be applied to the memory cell array area and peripheral circuit area in a memory other than the NAND type flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure method comprising:
performing a first exposure using a first mask, the first mask comprising a first transparent substrate, a pattern of a memory cell array provided on the first transparent substrate, wherein the memory cell array corresponds to a memory cell array area provided on a semiconductor substrate, and a first light shielding portion provided on the first transparent substrate, wherein the first light shielding portion corresponds to a peripheral circuit area provided on the semiconductor substrate; and
performing a second exposure using a second mask, the second mask comprising a second transparent substrate, a pattern of a peripheral circuit provided on the second transparent substrate, wherein the peripheral circuit area provided on the second transparent corresponds to the peripheral circuit area provided on the semiconductor substrate, and a second shielding portion provided on the second transparent substrate, wherein the second light shielding portion corresponds to the memory cell array area,
wherein the first mask further comprises a first area corresponding to a boundary area having a specific width provided between the memory cell array area and the peripheral circuit area, and the first area is provided with no pattern thereon, and
the second mask further comprises a second area corresponding to the boundary area, and the second area is provided with no pattern thereon.

2. The method according to claim 1, wherein the first exposure is performed by using a first exposure apparatus, the second exposure is performed by using a second exposure apparatus, and wherein the first exposure apparatus has higher resolution than the second exposure apparatus.

3. The method according to claim 1, wherein the boundary area on the semiconductor substrate is exposed by using the first and second exposures.

4. The method according to claim 1, wherein the pattern of the memory cell array area is a plurality of linear wirings which have width of a minimum design rule and have interval of space width of the minimum design rule, and the pattern of the peripheral circuit area has larger width than the plurality of linear wirings.

5. The method according to claim 4, further comprising performing an exposure for forming an upper layer wiring on the boundary area of the semiconductor substrate before performing the first and second exposures, and wherein the upper layer wiring has a larger width than the plurality of linear wirings.

6. The method according to claim 4, further comprising performing an exposure for forming an upper layer wiring on the boundary area of the semiconductor substrate after performing the first and second exposures, and wherein the upper layer wiring has higher width than the plurality of linear wirings.

7. The method according to claim 4, wherein the memory cell array area further comprises a wiring which is perpendicular to a longitudinal direction of the plurality of linear wirings and has a larger width than the plurality of linear wirings.

8. An exposure mask comprising:
a first mask including a first transparent substrate, a first exposure for drawing a pattern of a memory cell array area provided on the first transparent substrate, and a first light shielding portion provided on the first transparent substrate, wherein the first light shielding portion corresponds to a peripheral circuit area provided on the semiconductor substrate; and
a second mask including a second transparent substrate, a second exposure for drawing a pattern of the peripheral circuit area on the second transparent substrate, and a second shielding portion provided on the second transparent substrate, wherein the second light shielding portion corresponds to the memory cell array area,
wherein the first mask further comprises a first area corresponding to a boundary area having a specific width provided between the memory cell array area and the peripheral circuit area, and the first area is provided with no pattern thereon, and
the second mask further comprises a second area corresponding to the boundary area, and the second area is provided with no pattern thereon.

9. The mask according to claim 8, wherein the first and second masks are configured to perform double exposure.

10. The mask according to claim 8, wherein the pattern of the memory cell array area comprises a plurality of linear wirings which have a width of minimum design rule and have an interval of space width of the minimum design rule, and the pattern of the peripheral circuit area has larger a width than the plurality of linear wirings.

11. The mask according to claim 10, wherein the memory cell array area further comprises a wiring which is perpendicular to a longitudinal direction of the plurality of linear wirings and has a larger width than the plurality of linear wirings.

* * * * *